United States Patent [19]

Meunier et al.

[11] Patent Number: 4,793,872
[45] Date of Patent: Dec. 27, 1988

[54] III-V COMPOUND HETEROEPITAXIAL 3-D SEMICONDUCTOR STRUCTURES UTILIZING SUPERLATTICES

[75] Inventors: Paul L. Meunier; Manijeh Razeghi, both of Orsay, France

[73] Assignee: Thomson-CSF, Paris, France

[21] Appl. No.: 21,684

[22] Filed: Mar. 4, 1987

[30] Foreign Application Priority Data

Mar. 7, 1986 [FR] France .................. 86 03285

[51] Int. Cl.⁴ .............. H01L 27/14; H01L 29/161
[52] U.S. Cl. .................. 148/33.4; 148/33.6; 148/DIG. 65; 148/DIG. 72; 148/DIG. 97; 148/DIG. 110; 148/DIG. 160; 148/DIG. 164; 156/610; 156/613; 357/16; 437/51; 437/110; 437/133; 437/915; 437/976
[58] Field of Search .................. 437/915, 51, 84, 102, 437/104, 105, 110, 107, 126, 128, 127, 133, 969; 156/610-614; 148/DIG. 56, 65, 67, 72, 110, 119, 169; 357/16, 17, 30; 333/141, 149

[56] References Cited

U.S. PATENT DOCUMENTS

| | | | |
|---|---|---|---|
| 4,103,312 | 7/1978 | Chang et al. | 357/16 |
| 4,136,350 | 1/1979 | Tien | 357/17 |
| 4,392,115 | 7/1983 | Volluet et al. | 333/141 |
| 4,404,265 | 9/1983 | Manasevit | 156/610 |
| 4,517,047 | 5/1985 | Chang et al. | 148/175 |
| 4,578,142 | 3/1986 | Corboy, Jr. et al. | 437/102 |
| 4,592,791 | 6/1986 | Nakajima et al. | 437/126 |
| 4,609,407 | 9/1986 | Masao et al. | 437/915 |
| 4,677,633 | 6/1987 | Yamamato et al. | 372/45 |
| 4,679,061 | 7/1987 | Capasso et al. | 357/30 |
| 4,688,068 | 8/1987 | Chaffin et al. | 357/30 |
| 4,689,650 | 8/1987 | Dinan | 357/16 |

FOREIGN PATENT DOCUMENTS 2034384 1/1972 Fed. Rep. of Germany .
2403567 9/1977 France .
2030767 9/1978 United Kingdom .

OTHER PUBLICATIONS

2300 Journal of Crystal Growth, vol. 70, (1984), Dec. No. ½, Amsterdam, NL.
320 Applied Physics Letters, 46, (1985), Jan., No. 1, Woodbury, N.J., U.S.A.

Primary Examiner—Brian E. Hearn
Assistant Examiner—William Bunch
Attorney, Agent, or Firm—Oblon, Fisher, Spivak, McClelland, & Maier

[57] ABSTRACT

A component of semiconductor material deposited by epitaxial growth on a substrate having a predetermined and different lattice parameter consists of an alternate succession of layers of a first type and layers of a second type deposited on the substrate. The lattice parameter of the first type of layers is substantially matched with the lattice parameter of the substrate. In the case of the second type of layers, the lattice parameter is matched and even equal to that of the first type of layers. A component having a lattice parameter equal to that of the second type of layers is formed on the last layer of the second type. Moreover, the energy gaps of the two types of layers are different.

17 Claims, 3 Drawing Sheets

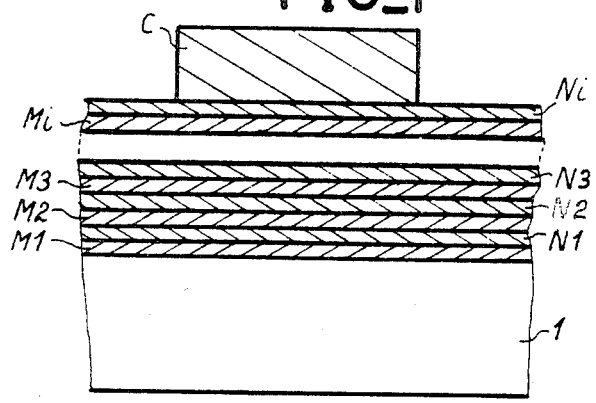
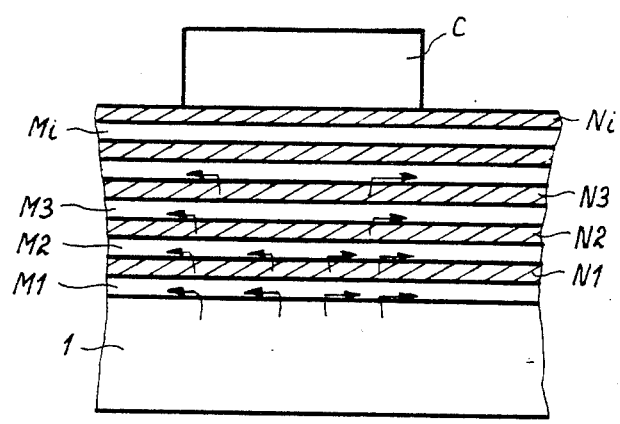
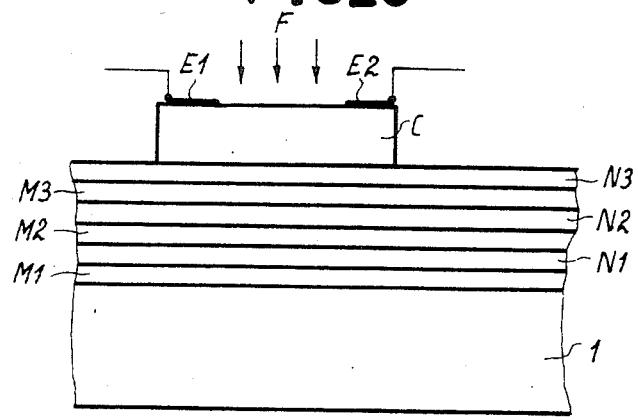

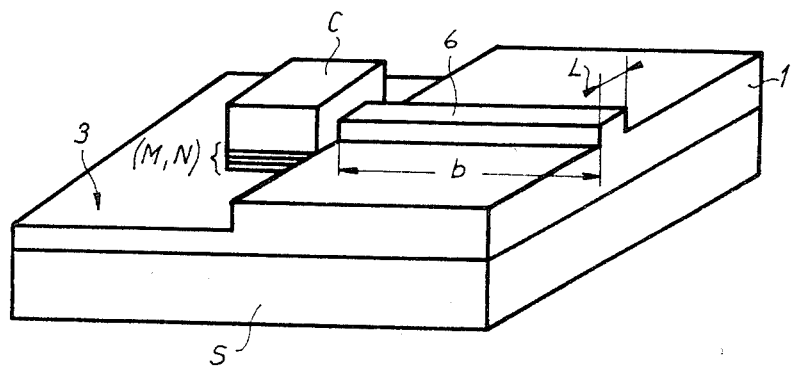
FIG_4
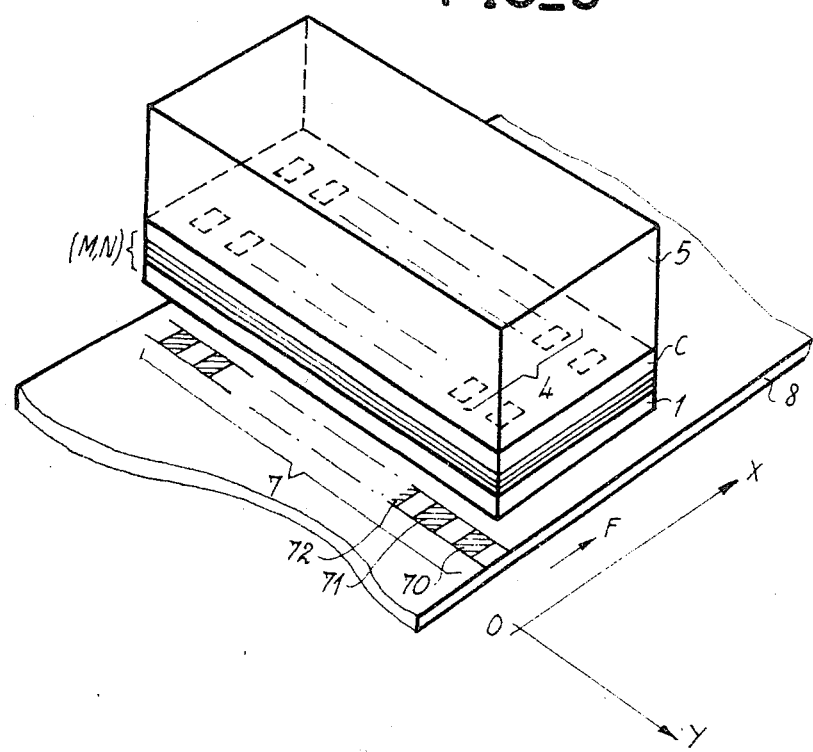
FIG_5

FIG_6
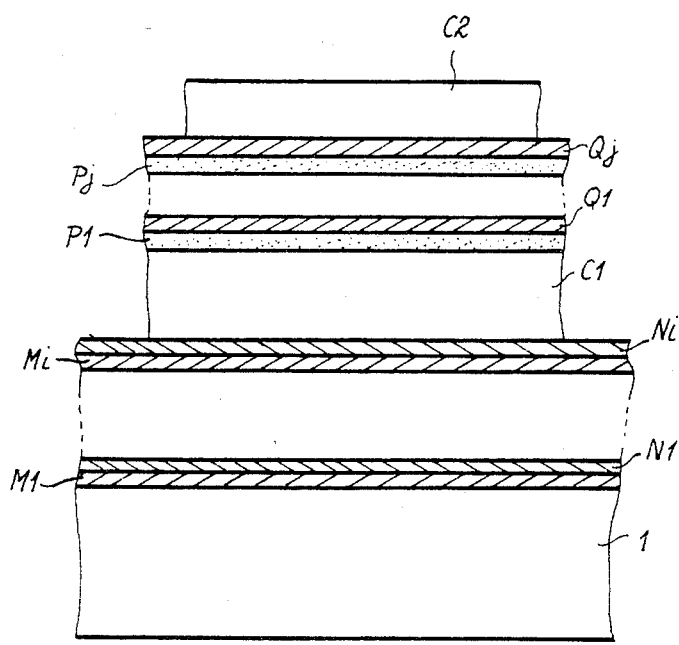

III-V COMPOUND HETEROEPITAXIAL 3-D SEMICONDUCTOR STRUCTURES UTILIZING SUPERLATTICES

BACKGROUND OF THE INVENTION

1. Field of the Invention

This invention relates to a component of semiconductor material deposited by epitaxial growth on a substrate having a different lattice parameter (lattice constant). The invention is also concerned with the application of said material to a wide range of semiconductor components such as diodes, photoresistors, integrated optical waveguides, optical isolators, optical circulators, magnetic detectors.

The invention is applicable in particular to a component of III-V compound material implanted into a substrate.

2. Description of the Prior Art

The fabrication of a component of this type is often difficult in practice since it is necessary to choose semiconductor material having a lattice parameter which is matched with the lattice parameter of the substrate. Thus the lattice parameter of a substrate of gadolinium-gallium garnet and having a value of 12.383 Ångströms is totally mismatched with respect to known semiconductor materials. In the field of light emitting and receiving diodes, French patent application No. 84 18928 filed on Dec. 11th, 1984 offered a solution by proposing by way of example a semiconductor material composition having a base of gallium, indium, aluminum and antimony (GaInAlSb) in which the lattice parameter of 6.19 Ångströms is substantially adjusted to one-half the lattice parameter of the gadolinium-gallium garnet.

However, adjustment of the lattice parameters to a multiple or a sub-multiple of the substrate lattice parameter calls for highly accurate dosing of the different metal-organic compounds employed. Furthermore, this dosing operation presupposes that the material has non-tailorable properties, that is, predetermined characteristics which could be determining factors in regard to the field of application.

The invention provides a component which is easier to produce and accordingly overcomes the disadvantages just mentioned.

To this end, the invention employs a known method of epitaxial growth of a succession of layers. This method calls for the use of a recent epitaxial growth technique of vapor-phase epitaxy known as metal-organic chemical vapor deposition (MOCVD). The succession of layers obtained by means of this method is known as a superlattice and is described in the article entitled "Growth and characterization of GaInAsInP heterojunction and quantum-well structures obtained by MOCVD" by Manijeh Razeghi, published in the Thomson-CSF Technical Review (Revue Technique), Vol. 16—No. 1—March 1984, pages 5 to 27, as well as in Chapter 5 entitled "Low-pressure metallo-organic chemical vapor deposition of $Ga_xInb_{1-x}As_yP_{1-y}$ alloys" by Manijeh Razeghi (paragraph IV, pages 317 to 345) published in the work entitled ∓Semiconductors and semimetals", Vol. 22, part A by Bell Telephone Laboratories.

The component obtained has the advantage of remaining undisturbed by any faults arising from dislocations at the component-substrate interface and is provided in the form of a single crystal.

SUMMARY OF THE INVENTION

The invention accordingly relates to a component of semiconductor material deposited by epitaxial growth on a substrate having a predetermined and different lattice parameter, there being formed on said substrate an alternate succession of layers of a first type and layers of a second type as well as a component formed on said succession of layers. The layers of the first type are formed of a first semiconductor material having a lattice parameter which is substantially matched with a multiple or a sub-multiple of the substrate lattice parameter. The layers of the second type are formed of a second semiconductor material having a lattice parameter which is matched with a multiple or a sub-multiple of the lattice parameter of the first material of the layers of the first type. The component is formed of material having the same lattice parameter as the second semiconductor material. The layers of the first type and the layers of the second type have different energy gaps.

BRIEF DESCRIPTION OF THE DRAWINGS

FIG. 1 illustrates one example of construction of the component in accordance with the invention.

FIG. 2 is an explanatory diagram of operation of the component in accordance with the invention.

FIG. 3 illustrates an example of construction of a photoresistor in accordance with the invention.

FIG. 4 illustrates an example of construction of an integrated isolator in accordance with the invention.

FIG. 5 illustrates an example of construction of a magnetic detector in accordance with the invention.

FIG. 6 illustrates an alternative embodiment of the invention in which provision is made for a plurality of superlattices.

DETAILED DESCRIPTION OF THE INVENTION

Referring first to FIG. 1, one example of construction in accordance with the invention will now be described.

A succession of layers M1 to Mi and N1 to Ni is grown on a substrate 1.

The substrate is of semiconductor material such as, for example, gallium arsenide (GaAs) or a gadolinium-gallium garnet (GGG). The substrate can also be of ferroelectric material and more generally of any material on which a semiconductor component is to be grown.

The layers M1, M2, . . . Mi are formed with semiconductor material having a lattice parameter $a_2$ which is substantially matched with a multiple or submultiple of the lattice parameter $a_1$ of the substrate.

The layers N1, N2, . . . Ni are formed with semiconductor material having a lattice parameter $a_3$ which is matched with the lattice parameter $a_2$ of the layers M1, M2, . . . Mi.

The layers M1, M2, . . . Mi have energy gaps which are distinctly different from the energy gaps of the layers N1, N2, . . . Ni. In consequence, the electron affinity of the layers M1 to M2 will be very different from the electron affinity of the layers N1 to Ni. At the interface between each layer N and the layer M which is superposed thereon, a spatial separation between electrons and impurities is accordingly observed, thus forming a high-density accumulation layer.

The crystal dissymmetries between the substrate 1 and the layer M1 and the difference in lattice parameters produce dislocation defects caused by mismatching of crystal lattice parameters between the substrate and the first epitaxial layer. In order to remove these defects, each transition between a layer M and a layer N produces a deviation of the dislocation angle. As indicated by arrows in FIG. 2, absorption of defects therefore takes place at each interface between a layer N and a layer M.

By providing a sufficient number of layers, there is thus obtained an attenuation of defects which does not reach the component C.

By way of example in the case of layers having a thickness of 50 to 150 Ångströms and with a total of approximately twenty layers, good absorption of defects is accordingly obtained.

The component C is formed of semiconductor material, the lattice parameter of which is matched with the lattice parameter a3 of the layer Ni and is even equal to the lattice parameter a3.

Growth of the different layers and of the component C is performed by epitaxy in accordance with a method known as vapor-phase epitaxy as described in particular in the documents mentioned earlier.

The present invention applies to a wide range of different components made of semiconductor materials and including, for example, diodes, lasers, waveguides, integrated transistors, optical isolators and optical detectors.

By way of example of practical application of the invention, FIG. 3 illustrates a photoresistor in which the component C is made of gallium-indium arsenide (GaInAs) and having electrical characteristics (impedances) which vary under the action of radiation having a wavelength within the range of 1.3 micrometers to 1.5 micrometers. The top portion of the photoresistor has two electrodes which provide electrical connections from the photoresistor to the utilization circuits. Furthermore, the top face of the photoresistors is illuminated by a radiation F having a wavelength which is detectable by the photoresistor.

The photoresistor C is of GaInAs and is constructed in a succession of layers M1 to M3 and N1 to N3 which are formed on a substrate 1 of gallium arsenide. The layers M1 to M3 are of indium phosphide. The layers N1 to N3 are of gallium-indium arsenide.

Said photoresistor C can be fabricated from another material which is sensitive to different wavelengths as explained earlier. It will be necessary in such a case to choose intermediate layers M1 to M3 and N1 to N3 which permit good attenuation of defects.

FIG. 4 illustrates an integrated isolator as described in French patent application No. 84 18928 filed on Dec. 11th, 1984. This isolator is formed by a layer 1 of ferrimagnetic material such as an yttrium-iron garnet (YIG) on a gadolinium-gallium garnet substrate S. This ferrimagnetic material has a lattice parameter which provides suitable matching with the gadolinium-gallium garnet substrate S.

A zone 3 of the layer 1 has been machined and carries an emitting diode C. The other zone of the layer 1 has a waveguide which is machined in the YIG layer. The dimensions (L, b) of the waveguide are such that the light emitted by the diode C cannot be reflected back to the diode and disturb its operation, hence the term "integrated isolator" which is used to designate this waveguide.

The diode C is fabricated on the YIG layer 1 after formation of a succession of layers M, N constituting a superlattice. The layers M and N will be formed as described earlier by means of III-V materials chosen as a function of their lattice parameter and energy gap.

Using the same technique as the isolator considered above, it is possible to construct a circulator which applies the invention by providing a plurality of emitting and receiving diodes connected together in pairs by means of the aforesaid isolators which are formed on the same substrate.

FIG. 5 is an illustration of a magnetic detector for a linear magnetoresistive-effect transducer. This transducer is mainly constituted by a layer C of semiconductor material, one face of which carries a layer 1 of ferrimagnetic material and the other face of which carries at least one pair of electrodes 4 disposed along an axis OX.

The transducer under consideration is so arranged that its layer 1 of ferrimagnetic material is placed in proximity to a magnetic support 8 to be read in such a manner as to ensure that a magnetic item of information 70 to 72 induces a magnetic field within the layer C of semiconductor material in a direction OY at right angles to the axis OX of the pair of electrodes.

In order to ensure correct operation of a transducer of this type, the layer C of semiconductor material should be matched with the layer 1 of ferrimagnetic material. By providing a superlattice consisting of a succession of layers M, N, an effective method is thus made available for guarding against any danger of lattice-mismatch defects.

As explained earlier, the invention is applicable to other types of components without thereby departing either from the scope or the spirit of the invention.

In an alternative embodiment of the invention, provision is made for a succession of stacked superlattices of the type described in the foregoing. For example, a first superlattice M1-Mi, N1-Ni is formed on a substrate 1 as illustrated in FIG. 6 and makes it possible to fabricate a first component C1. In order to form on the component C1 a second component C2 having a nature which differs from that of said component C1, a second superlattice P1-Pj, Q1-Qj is formed on the component C1. The nature on the one hand of the layers P1-Pj and on the other hand of the layers Q1-Qj is chosen as a function of their lattice parameters and energy gaps as already described in the case of the layers M1-Mi, N1-Ni. It is thus possible to form a component C2 on the component C1. As can readily be understood, a plurality of components such as C2 may accordingly be formed on the component C1.

As described in connection with the first superlattice M1-Mi, N1-Ni, the lattice parameter of the layers M1-Mi is substantially matched with the multiple or sub-multiple of the lattice parameter of the component C1. In the case of the layers N1-Ni, this lattice parameter is matched and even equal to the lattice parameter of the layers M1-Mi. The lattice parameter of the component C2 is equal to the lattice parameter of the layers N1-Ni.

Similarly, it would not constitute any departure from the scope of the invention to make provision for one or a number of components (not shown in the figure) which are formed on a component as designated by the reference C2 by means of another superlattice which permits lattice-matching.

The invention is applicable to components employed in the field of optoelectronics as well as the field of optical telecommunications or microwave techniques.

What is claimed is:

1. A device formed of semiconductor material deposited by epitaxial growth on a substrate having a predetermined and different lattice parameter, comprising on said substrate an alternate succession of layers of a first semiconductor material ranging in number (i) from 1 to n and layers of a second type ranging in number (i) from 1 to n as well as at least a first functional component for performing a predetermined function formed on said succession of layers, the layers of the first semiconductor material having a lattice parameter which is substantially matched with a multiple or a sub-multiple of the substrate lattice parameter, the layers of the second semiconductor material having a lattice parameter which is matched with a multiple or a sub-multiple of the lattice parameter of the first material, the functional component being formed of material having the same lattice parameter as the second semiconductor material, the energy gaps of the layers of the first semiconductor materials being different;

wherein said alternate succession of layers of said first and second semiconductor materials has interfaces which absorb dislocation defects caused by mismatching of crystal lattice parameters between the substrate and the first semiconductor material;

said device further comprising on said first functional component a second alternate succession of layers of a third semiconductor material and layers of a fourth semiconductor material as well as at least a second functional component formed on said second succession of layers, the lattice parameter of said third material being substantially matched with a multiple or sub-multiple of the lattice parameter of the material of the first functional component, the lattice parameter of the fourth material being matched with a multiple or sub-multiple of the lattice parameter of the third material, the lattice parameter of the second functional component being matched with the lattice parameter of the fourth material of the fourth layer.

2. A device according to claim 1, wherein the second semiconductor material has a lattice parameter which is equal to the lattice parameter of the first semiconductor material.

3. A device according to claim 1, wherein the substrate is a gadolinium-gallium garnet, the first material is indium phosphide (InP), said second material is gallium-indium arsenide (GaInAs).

4. A device according to claim 1, wherein the substrate is of ferrimagnetic material.

5. A device according to claim 1, wherein the substrate is gallium arsenide.

6. A device according to claim 4, wherein the ferrimagnetic material is yttrium-iron garnet (YIG).

7. A device according to claim 1, wherein the thickness of each layer is approximately 50 Ångströms to 150 Ångströms.

8. A device according to claim 1, wherein the number of layers is greater than ten layers.

9. A device according to claim 1, wherein the functional component is a laser diode.

10. A device according to claim 1, wherein the functional component is a photoresistor.

11. A device according to claim 1, wherein the functional component is an integrated optical waveguide.

12. A device according to claim 1, wherein the functional component is an integrated optical isolator.

13. A device according to claim 1, wherein the functional component is an optical circulator.

14. A component according to claim 3, wherein the component is a magnetic detector.

15. A device according to claim 1, wherein the first functional component is a photoresistor of gallium-indium arsenide formed on a substrate of gallium arsenide, the alternate succession of layers of the first material and layers of the second material being formed of indium phosphide in the case of the first material and of gallium-indium arsenide in the case of the second material.

16. A device according to claim 1, comprising a plurality of functional components including the second functional component formed on the second alternate succession of layers of the third and fourth materials.

17. A device according to claim 1 wherein a plurality of successions of layers are formed on the second functional component in order to integrate further functional components.

* * * * *